United States Patent
Sarti et al.

(10) Patent No.: US 7,742,908 B2
(45) Date of Patent: Jun. 22, 2010

(54) METHOD FOR SIMULATING AN ELECTRICAL CIRCUIT BY SYNTHESIS OF A PHYSICAL MODEL, DEVICE FOR SIMULATING AN ELECTRICAL CIRCUIT, IN PARTICULAR A MUSICAL INSTRUMENT OBTAINED WITH THAT METHOD

(76) Inventors: Augusto Sarti, Via Solferino 125, 20038 Seregno (IT); Stefano Tubaro, Via Prelle 21, 28100 Novara (IT); Giovanni De Sanctis, Via Ugo La Malfa 6/21, 20060 Vignate (IT)

( * ) Notice: Subject to any disclaimer, the term of this patent is extended or adjusted under 35 U.S.C. 154(b) by 424 days.

(21) Appl. No.: 11/793,788

(22) PCT Filed: Sep. 29, 2005

(86) PCT No.: PCT/IB2005/002902

§ 371 (c)(1),
(2), (4) Date: Jun. 21, 2007

(87) PCT Pub. No.: WO2006/035304

PCT Pub. Date: Apr. 6, 2006

(65) Prior Publication Data

US 2008/0140378 A1    Jun. 12, 2008

(30) Foreign Application Priority Data

Sep. 29, 2004    (IT)    .......................... BG2004A0038

(51) Int. Cl.
G06F 17/50    (2006.01)

(52) U.S. Cl. ....................................... 703/14

(58) Field of Classification Search .................. 703/14; 381/63

See application file for complete search history.

(56) References Cited

U.S. PATENT DOCUMENTS 6,748,355 B1 *    6/2004    Miner et al. ................ 704/203

(Continued)

OTHER PUBLICATIONS

Pedersini et al., Object-based sound synthesis for virtual environments using musical acoustics, Nov. 2000, IEEE Signal Processing Magazine.*

(Continued)

*Primary Examiner*—Paul L Rodriguez
*Assistant Examiner*—Aniss Chad
(74) *Attorney, Agent, or Firm*—Perkins Coie LLP

(57) ABSTRACT

Method for simulation of an electrical circuit by synthesis of a physical model, using digital wave structures including the following steps: within the framework of digital wave structure, consider a serial and parallel adapter block with at least three ports of which one adapted; represent said electrical circuit connecting the elements together by means of a plurality of said adapter blocks; connect each adapter block to the adapted port of the previous adapter block; consider the plurality of said adapter blocks as nodes of a binary tree and said elements of said electrical circuit as leaves of said binary tree; apply an element of the aforesaid electrical circuit to the adapted port of the root node; consider, for each port, an incident wave and a reflected wave; starting from the lower leaves of the tree and moving towards the root, calculate each reflected wave; assess the reflected wave of the element connected to the adapted port of the root; starting from the root and moving towards the lower leaves of the tree, calculate each incident wave; update the status of any dynamic elements present in the leaves.

18 Claims, 4 Drawing Sheets

U.S. PATENT DOCUMENTS 6,751,322 B1 * 6/2004 Carlbom et al. ............... 381/63

OTHER PUBLICATIONS

Sarti et al., Toward Nonlinear Wave Digital Filters, Jun. 1999, IEEE Transactions on Signal Processing, vol. 47, No. 6.*

Anonymous, A Simulation Tool using Wave Digital Structures (manual), Mar. 2002, University of Paderborn.*

Digital soundsynthesis of string instruments with the functional transformation method, Rabenstein et al., Oct. 2002, Signal Processing, University of Erlangen-Nurnberg.*

* cited by examiner

METHOD FOR SIMULATING AN ELECTRICAL CIRCUIT BY SYNTHESIS OF A PHYSICAL MODEL, DEVICE FOR SIMULATING AN ELECTRICAL CIRCUIT, IN PARTICULAR A MUSICAL INSTRUMENT OBTAINED WITH THAT METHOD

This application is a national stage filing under 35 U.S.C. 371 of International Application PCT/IB2005/002902, filed on Sep. 29, 2005, which claims the benefit of Italian Application No: BG2004A000038, filed on Sep. 29, 2004. The entire teachings of the referenced Applications are incorporated herein by reference. International Application PCT/IB2005/002902 was published under PCT Article 21(2) in English.

DESCRIPTION

This invention refers to a method for simulating an electrical circuit by synthesis of a physical model, and to a device for simulating an electrical circuit, in particular a musical instrument obtained with that method.

Sound synthesis has always concentrated basically on the characteristics of the sound to be reproduced rather than on the instruments able to generate it. In particular, attention has been focused on producing a sound according to its description in the time or frequency domain, neglecting the physical mechanism that may have generated it. However, an alternate approach exists that attempts to model the musical instrument (whether real or virtual) rather than the sound produced, through digital simulation of its behavior.

Synthesis by physical models may also help to understand the physics of a musical instrument, operating as a test bench for checking a particular model and making it possible to identify the main factors that contribute to determining the sound of the instrument. Also, it can be observed that algorithms are used characterized by a limited number of control parameters, almost always matching those of the real instrument and therefore consistent with the gestual experience of the musician.

Obviously, there is a price to pay and this lies in the greater complexity of the algorithms. For this reason, only recent developments of electronic technologies, which have made available powerful calculation tools with modest investments, have made it possible to use these techniques for real-time production of sound.

A suitable technique for object modeling of a physical system is that based on digital wave structures. One of the main advantages of this method is, in fact, the possibility of distinguishing the individual elements that form the model instead of applying global discretization of the set of differential equations that describe the system in its entirety. The method permits modeling according to concentrated parameters, such as weights, small springs or clutches, elements of negligible size if compared with the wavelength of the signals concerned, so much so that they can be considered material points. However, the possibility exists of interfacing with distributed parameter structures, such as cords or resonant structures, provided these are equipped with one or more connection ports (signal excitation or tapping points). This type of structures is in fact essential to model a musical instrument.

Existing techniques for automatic implementation of a digital wave structure according to a high-level description of the model are based on construction of a linear system, in more or less the same manner as that used in classical theory of electronic circuits with the tableau method.

The aim of this invention is to automatize the process of physical and dynamic modeling of the interactions between the objects and, in particular, to define a method for automation of the simulation of digital wave structures oriented towards object modeling.

An object of the present invention is a method for simulation of an electrical circuit by synthesis of a physical model, using digital wave structures including the following steps: consider within the framework of digital wave structure, a serial and a parallel adapter block with at least three ports of which one adapted; represent said electrical circuit connecting the elements together by means of a plurality of said adapter blocks; connect each adapter block to the adapted port of the previous adapter block; consider the plurality of said adapter blocks as nodes of a binary tree and said elements of said electrical circuit as leaves of said binary tree; apply an element of the aforesaid electrical circuit to the adapted port of the root node; consider, for each port, an incident wave and a reflected wave; starting from the lower leaves of the tree and moving towards the root, calculate each reflected wave; assess the reflected wave of the element connected to the adapted port of the root; starting from the root and moving towards the lower leaves of the tree calculate each incident wave; update the status of any dynamic elements present in the leaves.

Another object of the present invention is a method for simulation of a physical model including the steps of conversion of the aforesaid physical model into an equivalent electrical circuit and application of the steps of the method in accordance with the method for simulation of an electrical circuit, as described above.

A further object of the present invention is a method for simulation of a musical instrument including the steps of representing said musical instrument with a physical model and application of the steps of the method in accordance with the method for simulation of a physical model described above, to the purpose of obtaining the generation of sounds produced by said simulation of a musical instrument.

A further object of the present invention is an electric circuit obtained by applying the method for simulation of a musical instrument described above.

A further object of the present invention is a device simulating a musical instrument able to generate sounds obtained by applying the method for simulation of an electric circuit described above.

A further object of the present invention is a computer program, recorded on a support that can be used by said computer, to control execution of all the steps in accordance with the method for simulation of an electrical circuit described above.

Further characteristics of the invention are described in the dependent claims.

The Applicant has discovered that any minimal digital wave structure can be considered as a binary tree in which the adapters represent the nodes while the bipoles are represented by the leaves.

Apart from its characteristic of being an intrinsically explicit method, the typical pointer-type organization of the tree considerably simplifies management of time-variant topologies (which can be displayed as grafts, pruning, etc.) and, therefore, interaction between objects. Another original result refers to extraction of the dynamics from the macro-adapter that makes it possible to obtain a tree-like structure that describes only the topology of the network, with significant fallbacks on calculation costs. Lastly, an automatic system able to simulate a network of wave structures according to a high-level symbolic description has been implemented.

The characteristics and advantages of this invention are highlighted in the following detailed description of a practical embodiment thereof illustrated, for example purposes and not in a limiting sense, in the attached drawings in which.

Figures 1A, 1B:
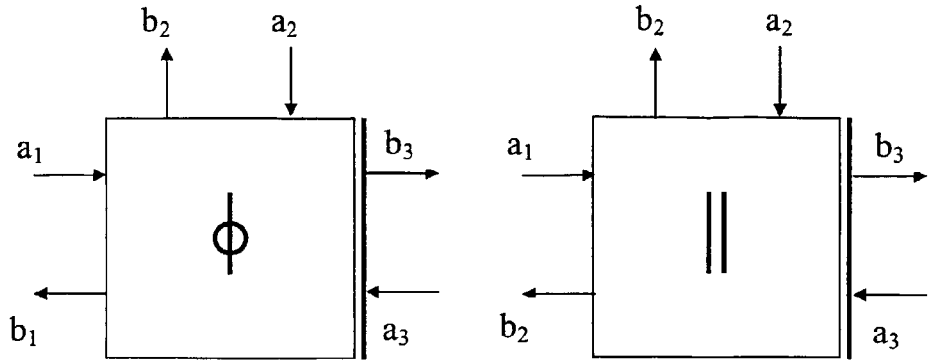
FIG. 1a shows a graphic symbol of a serial adapter and FIG. 1b illustrates a graphic symbol of a parallel adapter.

A linear transformation is defined as $$a = V + R_o I$$

$$b = V - R_o I$$

where a and b are called wave variables, while $R_o$ is a parameter called a reference resistance. If $R_o$ is other than zero, the inverse transformation can be obtained $$V = (a+b)/2$$

$$I = (a-b)/2R_o$$

The variables depend on their physical interpretation, considering a and b as voltage waves that are propagated along a transmission line with a characteristic impedance of $R_o$. In particular, a is the incident wave and b the wave reflected by the load.

The laws of Kirchhoff regarding N bipoles connected in series in which a current $i_m$ flows and on which there is a voltage drop $v_m$, m=1, ..., N, have the following form:

$$\sum_{m=1}^{N} v_m = 0$$

$$i_1 = i_2 = \ldots = i_N.$$

Replacing the wave variables $$a_m = v_m + R_m i_m, \quad b_m = v_m - R_m i_m$$

where $R_m$ is the resistance at the $m^{th}$ port and explicating the reflected waves, the following is obtained $$b_m = a_m - \gamma_m (a_1 + a_2 + \ldots + a_N)$$

where $\gamma_m$ is the reflection coefficient of the $m^{th}$ port defined as $$\gamma_m = \frac{2R_m}{R_1 + R_2 + \ldots + R_N}.$$

The definition of $\gamma_m$ is followed immediately by $$\sum_{m=1}^{N} \gamma_m = 2$$

therefore one of the N coefficients can be expressed according to the other N−1.

Similarly, as seen for the serial junction, repeating the same steps but inverting the role of current and voltage, the following is obtained $$\sum_{m=1}^{N} i_m = 0$$

$$v_1 = v_2 = \ldots = v_N.$$

Replacing the wave variables $$a_m = v_m + R_m i_m e \quad b_m = v_m - R_m i_m$$

at the $m^{th}$ port and explicating the reflected waves, the following is obtained $$b_m = (\delta_1 a_1 + \delta_2 a_2 + \ldots + \delta_N a_N) - a_m$$

where $\delta_m$ is the reflection coefficient of the $m^{th}$ port, defined as $$\delta_m = \frac{2G_m}{G_1 + G_2 + \ldots + G \ldots}$$

The definition of δm formally identical to that $$G_m = \frac{1}{R_m}$$

of $\gamma_m$ for the serial junction leads also in this case to and one of the N coefficients can be expressed according to $$\sum_{m=1}^{N} \delta_m = 2$$

of the other N−1.

A multi-port junction is usually characterized by instantaneous dependence between reflected wave and incident wave on each port. However, suitably selecting the reference resistances, it is possible to cancel reflection of the incident wave at one of the ports. As will be seen below, this makes it possible to guarantee commutability of the digital wave filter and will also permit introduction of a non-linear bipole in the circuit.

Setting $\gamma_N = 1$ for the serial junction and $\delta_N = 1$ for the parallel junction, the wave $b_N$ is made independent of $a_N$. A junction with a unitary reflection coefficient is called adapter. According to the definition of $\gamma_N$ and $\delta_N$, the value of the impendence to be placed on the adapted port is easily obtained.

serial $$\gamma_N = 1 \Rightarrow R_N = \sum_{i=1}^{N-1} R_i$$

and parallel $$\delta_N = 1 \Rightarrow G_N = \sum_{i=1}^{N-1} G_i$$

that is to say, the impedance of the adapted port of a serial adapter is equal to the sum of the impedances of all the other ports while that of a parallel adapter is given by the parallel of the impedances of all the other ports.

Unfortunately, it is not possible to have more than one adapted port as, having established that all the ports have a resistance greater than zero, we obtain $0<\gamma_m$, $\delta m \leqq 1$ and setting two coefficients equal to 1, all the others should be nil. The relationships that link each reflected wave to the incident waves to an adapter may be summed up as follows:

serial adapter $$b_m = a_m - \gamma_m \sum_{i=1}^{N} a_i, \ 1 \leq m < N$$

$$b_N = a_m - \gamma_N \sum_{i=1}^{N} a_i = -\sum_{i=1}^{N-1} a_i$$

and parallel adapter $$b_m = \sum_{i=1}^{N} \delta_i a_i - a_m, \ 1 \leq m < N$$

$$b_N = \sum_{i=1}^{N} \delta_i a_i - a_m = \sum_{i=1}^{N-1} \delta_i a_i$$

These can also be expressed in matrix form and, in the case in which N=3, it is possible to express everything according to a single reflection coefficient:

serial $$b = \begin{bmatrix} 1-\gamma_1 & -\gamma_1 & -\gamma_1 \\ -\gamma_2 & 1-\gamma_2 & -\gamma_2 \\ -\gamma_3 & -\gamma_3 & 1-\gamma_3 \end{bmatrix} a = \begin{bmatrix} 1-\gamma_1 & -\gamma_1 & -\gamma_1 \\ \gamma_1-1 & \gamma_1 & \gamma_1-1 \\ -1 & -1 & 0 \end{bmatrix} a$$

and parallel $$b = \begin{bmatrix} \delta_1-1 & \delta_2 & \delta_3 \\ \delta_1 & \delta_2-1 & \delta_3 \\ \delta_1 & \delta_2 & \delta_3-1 \end{bmatrix} a = \begin{bmatrix} \delta_1-1 & 1-\delta_1 & 1 \\ \delta_1 & -\delta_1 & 1 \\ \delta_1 & 1-\delta_1 & 0 \end{bmatrix} a$$

where a and b are vectors containing, respectively, the incident waves and the reflected waves.

FIG. 1a shows a graphic symbol of a serial adapter with three ports of which the third is adapted.

FIG. 1b shows a graphic symbol of a parallel adapter with three ports of which the third is adapted.

It is demonstrated that a dynamic adapter is, to all effects, equivalent to an instantaneous adapter of the same type (serial or parallel) with a scattering cell with memory connected to its adapted port, and at the most two dynamic transformers to the non-adapted ports for the parallel adapter. Extracting all the dynamics from the macro-adapter, this will once again represent only the topology of the circuit, thereby considerably enhancing efficient automatic implementation of the structure.

In particular, a serial dynamic adapter is identical to its instantaneous equivalent and a dynamic scattering cell connected to the adapted port, the latter having as reflection filter that at the adapted port of the initial filter, minus the constant term.

A serial dynamic adapter is defined by the following formula:

$$B = \overline{M}_S A + \begin{bmatrix} 0 \\ 0 \\ \tilde{\Gamma}_3(\overline{B}_3 - A_3) \end{bmatrix} + \overline{M}_S \begin{bmatrix} 0 \\ 0 \\ \tilde{\Gamma}_3(\overline{B}_3 - A_3) \end{bmatrix} =$$

$$A = \overline{M}_S \begin{bmatrix} A_1 \\ A_2 \\ A_3(1-\tilde{\Gamma}_3) \end{bmatrix} + \overline{M}_S \begin{bmatrix} 0 \\ 0 \\ \tilde{\Gamma}_3 \overline{B}_3 \end{bmatrix} - \begin{bmatrix} 0 \\ 0 \\ \tilde{\Gamma}_3 A_3 \end{bmatrix} + \begin{bmatrix} 0 \\ 0 \\ \tilde{\Gamma}_3 \overline{B}_3 \end{bmatrix}$$

$$B = \begin{bmatrix} N_1^{-1} & 0 & 0 \\ 0 & N_2^{-1} & 0 \\ 0 & 0 & 1 \end{bmatrix} \left( \overline{M}_P \begin{bmatrix} N_1 A_1 \\ N_2 A_2 \\ A_3(1-\tilde{\Gamma}_3) \end{bmatrix} + \overline{M}_P \begin{bmatrix} 0 \\ 0 \\ \tilde{\Gamma}_3 \overline{B}_3 \end{bmatrix} + \begin{bmatrix} 0 \\ 0 \\ \tilde{\Gamma}_3(\overline{B}_3 - A_3) \end{bmatrix} \right)$$

The entire topology or a digital wave structure is described as the union of all the junctions (serial, parallel or simple scattering cells) that form the network and is called macro-junction. If the macro-junction consists only of adapters, it is known as a macro-adapter. In this case, it is possible to guarantee computability of the filter if the following rules are complied with:

each non-adapted port of an adapter must be connected to the adapted port of another adapter or to a bipole;

the adapters must never form loops.

In this way, the macro-adapter will provide an adapted port that can be used to connect a non-adapted bipole (e.g. an ideal generator) or a non-linearity.

Figures 2A, 2B:
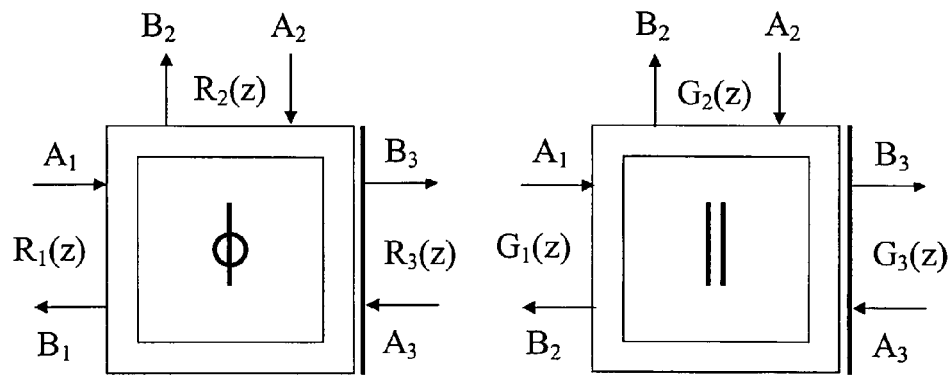
FIG. 2a shows a graphic symbol of a serial dynamic adapter and FIG. 2b shows a graphic symbol of a parallel dynamic adapter.

FIG. 2a shows a graphic symbol of a serial dynamic adapter with three ports of which the third is adapted.

FIG. 2b shows a graphic symbol of a parallel dynamic adapter with three ports of which the third is adapted.

Figure 3:
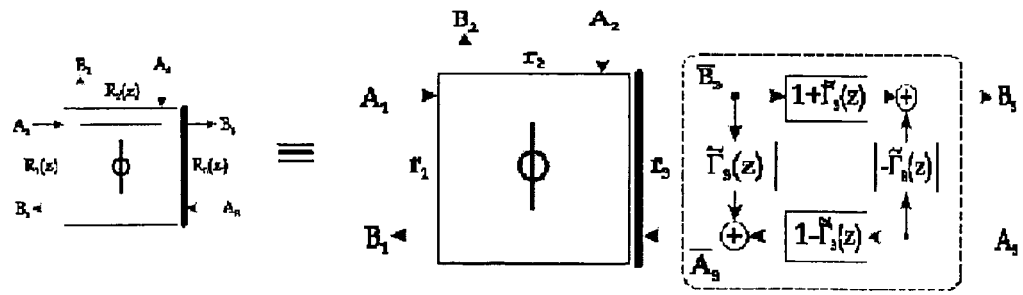
FIG. 3 illustrates the equivalence of a serial dynamic adapter and an instantaneous adapter with a dynamic scattering cell located on the adapted port.

FIG. 3 shows the equivalence of a serial dynamic adapter and an instantaneous adapter with a dynamic scattering cell located on the adapted port.

The above description provides the instruments necessary to construct a structure able to model a physical system, interconnecting elementary blocks using one or more ports made available by these. The adapters may have N ports of which one adapted; without losing generality, adapters having only three ports will be considered below as any N-port adapter can be broken down to interconnection of N−2 three-port adapters.

To unite these "bricks", adapters have been defined that, in addition to acting as a sort of adhesive, guarantee compliance with the laws of continuity, represented in the electric case by the Kirchhoff laws. Reference will be made once again to the electrical analogy but it must be remembered that what has been set forth above can be repeated, in a completely equivalent manner, for mechanical or fluid-dynamic systems more suitable for modeling musical instruments.

In fact, physical systems are usually simulated with analogue electrical circuits exploiting the similarities between the various domains. In the electrical domain, the variables involved are voltages and currents, in the mechanical domain, the variables are speed and flow whereas in the fluid-dynamic domain, the variables are force and pressure.

Once in possession of the continuous time reference model of the physical system, regardless of whether this is of the mechanical, fluid-dynamic or electrical type or even a mixture of these domains, it must be converted into a discrete time electrical system so that it can be simulated using a computer.

Implementation of digital wave structures on a computer is based on description of the circuit using an appropriate data structure and a method of resolution that makes it possible to calculate the vector of incident and reflected waves at each port.

If the circuit is instantaneous, applying the method once only to the data structure, the vector containing the solution is obtained, that is to say the set of waves that comply with the constraints imposed by the circuit. However, in all cases of practical interest, the circuits are dynamic and this vector represents the memory of the network; therefore, once an initial status has been assigned to this, any iteration performs an update, that is to say resolution at the sampling instant following that considered.

Use of an approach based on direct inspection of the digital wave structure promotes improved computational efficiency without having to sacrifice the flexibility inherent in classical methods (tableau).

Without going into much detail, we can consider a macro-adapter consisting only of non-dynamic 3-port adapters. Any dynamic adapters can be broken down into instantaneous adapters and dynamic scattering cells transporting the latter to the ends of the bipoles according to suitable rules of equivalence.

Figure 4:
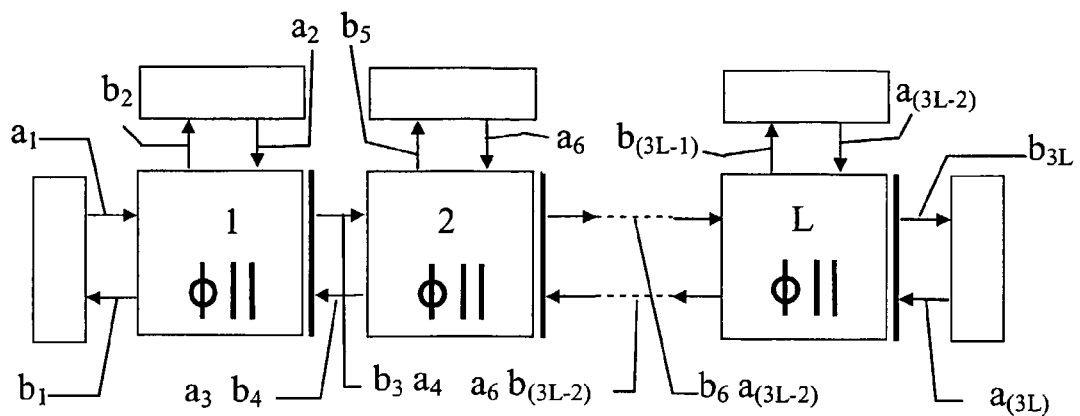
FIG. 4 shows an example of a cascade structure.

A simple digital wave structure useful for describing the tree method consists of L adapters cascade connected, where each adapter is connected to the adapted port of the adapter that precedes it, except for the first, which is connected to two bipoles, and the last whose adapted port connects a non-linear bipole, as can be seen in FIG. 4.

Even if many circuits have a similar configuration, they represent a very particular type of structure; however, once the functioning mechanism in this situation has been understood, extension to the more general case will be immediate.

The steps to obtain the vector b on the basis of the known elements of a is described below. In fact, vector a is not completely known; only the elements corresponding to the ports connected directed to the linear bipoles are known:

$a_i(n)=0$ if the bipole is an adapted resistor;
$a_i(n)=V_i$ if the bipole is an adapted real generator;
$a_i(n)=\pm b_i(n-1)$ if the bipole is reactive.

Once the circuit has been initialized, the known elements of a will be as follows:

$$a=[a_1, a_2, x, x, a_5, x, \ldots, x, a_{3L-1}, x]^T$$

where x is the unknown value.

Starting from the first adapter, the only one whose two inputs ($a_1$ and $a_2$) are known, the wave reflected from its adapted port is calculated $b_3=f(a_1, a_2)=k_{11}a_1+k_{12}a_2$, (being $k_{11}$ and $k_{12}$ suitable constants depending on the reflection coefficient of the adapter considered); it does not in fact depend on $a_3$ because the port is adapted.

Port 3 is connected to port 4; therefore both $a_5$ (from the bipole) and $a_4=b_3$ calculated in the previous step are now known.

The previous steps are repeated up to the last adapter obtaining a number of elements of a and b, $$a=[a_1, a_2, x, a_4, a_5, x, \ldots, a_{3L-2}, a_{3L-1}, x]^T$$

$$b=[x, x, b_3, x, x, b_6, \ldots, x, x, b_{3L}]^T$$

Using the characteristic function of the non-linear bipole N.L., the following is obtained $a_{3L}=f_{NL}(b_{3L})$.

If necessary, it is now possible to calculate $b_{3L-1}$ and/or $b_{3L-2}$ and therefore to trace the entire network, calculating $b_{3i-1}$ and $b_{3i-2}$ so as to arrive at the first adapter. It may not be necessary to calculate all the $b_{3i-k}$ (k=1, 2), for example in the case of ports connected to resistor (no reflection).

Once the value of b is known, it is possible to update a using the characteristics of the bipoles. Therefore, the procedure is repeated to obtain the value of b at the next instant.

Figure 5:
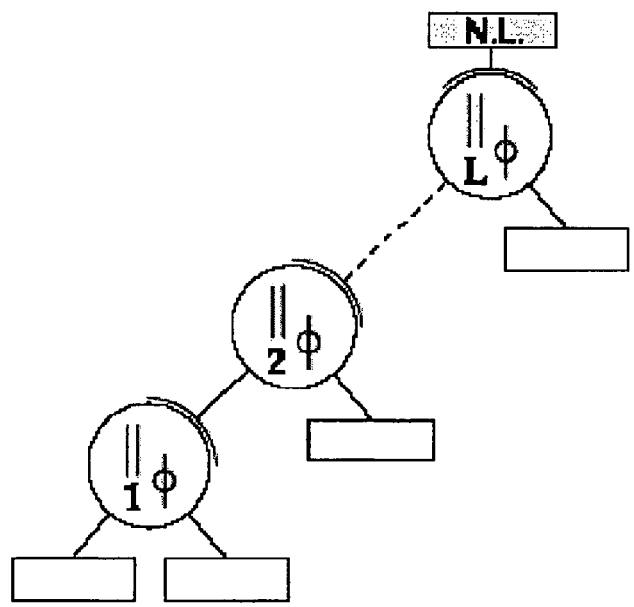
FIG. 5 shows an example of a tree-like structure.

The circuit just described may be generalized admitting that both the non-adapted ports can be connected to the adapted ports of other adapters. The resulting structure can be seen as a binary tree in which the nodes represent the adapters. The root represents the adapter to which the non-linear bipole is connected, while the leaves will be all the linear bipoles, as can be seen in FIG. 5.

Therefore, the method is extended replacing the "outwards" scanning (towards the non-linearity) with scanning of the tree starting from the leaves and moving up to the root, while the "return" scanning is obtained reaching the leaves again.

If the network contains dynamic components, said as capacitors and inductors, it is necessary to determine the content of the memory cells associated to these according to the initial conditions provided. This operation makes it possible to reconstruct the history of the network that would be obtained if this were already evolving and if, at the moment of initialization, the voltages across the capacitors and currents circulating in the inductors were precisely those imposed by the initial conditions. Therefore, each of these conditions consists in setting one of the two Kirchhoff variables on each port of the network characterized by dynamics (a condition for each memory cell is required) but, as both the current and voltage are required to obtain the value of the wave that initializes a memory cell, the missing value must be determined.

In other words, it is necessary to resolve the network in which the dynamic components have been replaced with ideal generators in order to impose the related Kirchhoff variable.

During the initialization phase, the reactive components are formally replaced by ideal generators; therefore, it is not possible to use the wave variables directly insofar as it will not be possible to compute the resulting structure. However, it is still possible to exploit the tree structure that describes the connections between the bipoles also in the Kirchhoff domain in a very efficient manner. In particular, it is easy to calculate the voltage-current characteristic of the sub-tree at a generic node knowing those of the two son nodes. In fact, as the part of the circuit described by the tree is linear, these characteristics are straight lines that can be represented according to the Tevenin or Norton equivalent using two numbers indicating the value of an ideal generator (intersection of the straight line with one of the axes) and its accompanying resistance (gradient of the straight line). Therefore, knowing the straight lines of two sub-trees and the type of node that connects these (serial or parallel), the straight line that describes the total bipole is calculated using simple rules. Practically speaking, it is advisable to use only the Tevenin equivalent except in the case of ideal current generators for which this is not defined. Initially, the characteristics of all the bipoles are known having replaced capacitors and inductors with, respectively, ideal voltage and current generators. Moving down along the tree as far as the root, the characteristics are calculated and saved at each node. Once the characteristic at the root is known, i.e. that of the entire tree, it is possible to think of the network as broken down into its linear part, replaced by the equivalent just calculated, and into the non-linear bipole. The voltage-current curve of the latter, known beforehand, intersected with the straight line of the linear part, makes it possible to find the work point of the non-linear bipole. In the case in which the non-linear function is given in analytical form, the intersection between the two curves can be located using an iterative digital method said as the Newton-Raphson algorithm. If, on the other hand, the characteristic is defined using a table, locating the point closest to the load straight line and that immediately after (lying in the other half-plane identified by the straight line itself) it is possible to obtain, in closed form, the work point as intersection between the curve which interpolates the two points and the straight line.

If the non-linear bipole is dynamic, it is not possible to calculate the work point as intersection between the load straight line and non-linear characteristic as the latter is not defined in the current-voltage plane. The initial conditions and the equivalent circuit must be provided during the initialization phase.

There are cases in which it is not possible to obtain missing voltages and currents using the equivalents, for example when attempting to obtain the current value from an ideal voltage generator. To overcome this problem, it is sufficient to explore first of all the second branch and then obtain the indeterminate value on the first branch using the laws of Kirchhoff. Indetermination on both sub-trees is not possible because this would mean having a degenerate circuit, i.e. containing meshes of ideal generators and capacitors or sets of current generator and inductor sizes. The voltage and current values at the nodes of the second level of the tree are now known. If these are dynamic bipoles, it is possible to calculate the value of the wave that initializes their memory cell. If an instantaneous bipole is present, the algorithm on branch stops; otherwise, if another adapter is present, the procedure just described is repeated using the new current and voltage values just calculated, reiterating on each branch until a bipole is reached.

Briefly, the initialization process is also divided into two steps: an exploration of the tree which starts from the leaves and arrives at the root, and one in the opposite direction. In the first, the straight lines that describe the relationship between the current and voltage at each node are described so that, at the second passage, knowing one of the two values, these straight lines can be used to obtain the other.

Figure 6:
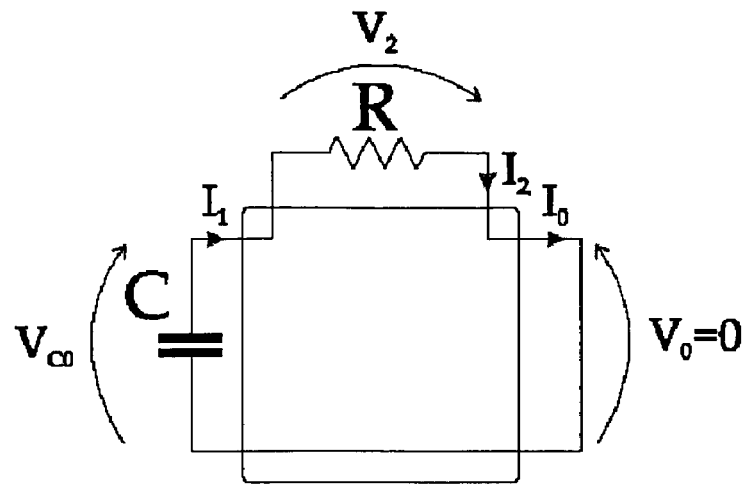
FIG. 6 shows an example of an RC circuit.

For example, initialization of an RC circuit (see FIG. 6) consists in determining the current circulating in the mesh given the initial condition $V_c(0)=V_{c0}$, so as to obtain the reflected wave value at the port of the capacitor bipole and assign this to the memory cell:

mem=$b=V_{c0}-R_1I_{c0}$, where $R_1$ is the port resistance of the capacitor.

Figure 7:
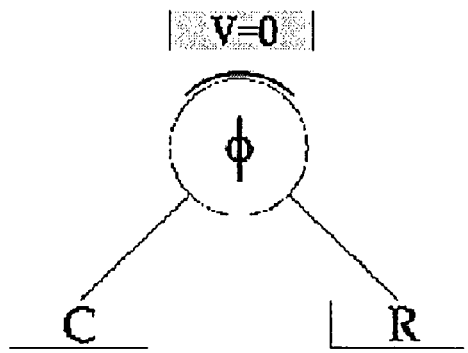
FIG. 7 shows an example of a tree-like structure with serial adapters for an RC circuit.
Figure 8:
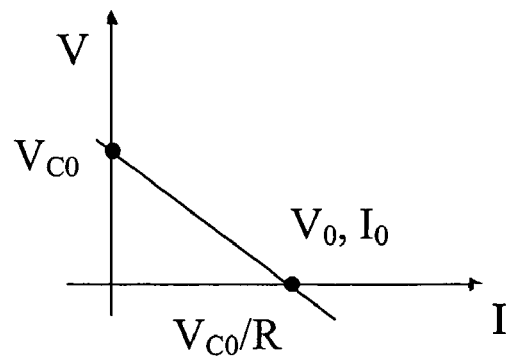
FIG. 8 shows a characteristic curve of the circuit of FIG. 6.

There are several solutions for implementing a similar circuit in the wave domain and one of these, illustrated in FIG. 7, uses a serial adapter whose adapted port is connected to a short-circuit, i.e. an ideal nil voltage generator, V=0.

The "outwards" scanning consists in obtaining the equivalent bipole seen at the root of the tree which is given by the series of an ideal voltage generator $V_{c0}$ (the equivalent of the capacitor) and the resistance R. Its characteristic curve, using the generator convention, is a straight line that crosses the axis of the voltages at point $V_{c0}$ and has a gradient equal to −R. Once the work point ($V_0=0$, $I_0=V_{c0}/R$) has been obtained, calculated intersecting the straight line found with the short-circuit characteristic, the "return" scanning session starts. If it is decided to visit first of all the left-hand branch, i.e. the branch that is connected to the capacitor, $I_{c0}=I_2=I_0$ is obtained as the serial adapter "conserves" the currents and, together with the initial condition $V_{c0}$, makes it possible to search for the wave value required. Following this path, it is not necessary to visit the leaf referring to resistance as it does not contain memory cells to be initialized but it has however been taken into account during the "outward" scanning when the characteristic of the entire tree was traced. The same result could have been obtained visiting the resistance before the capacitor. In this case, the value of $V_2$ could have been obtained according to $I_2=I_0$, exploiting the characteristic of the resistance R: $V_2=-RI_2$. Applying the other law of Kirchhoff, the following would have been obtained $V_c(0)=V_1=V_o-V_1=0+RI_2=0+RI_0=V_{co}$.

Figure 9:
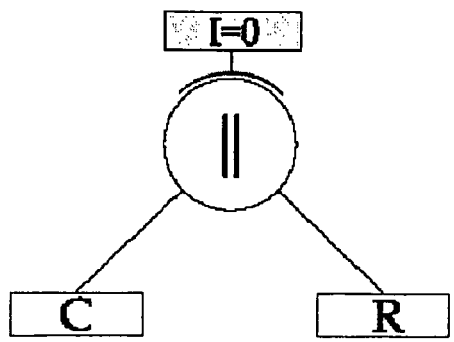
FIG. 9 shows an example of a tree-like structure with parallel adapters for an RC circuit.

The same circuit can be implemented using a parallel adapter (see FIG. 9), having the adapted port connected to an open circuit, i.e. a nil current ideal generator, I=0. The equivalent circuit seen at the root of the tree is an ideal voltage generator (the capacitor) as the resistance R placed in parallel to this does not modify its characteristic. The intersection with the straight line I=0 of the open circuit bipole makes it possible to find the work point ($V_0=V_{co},I_o=0$). This time, the resistance R has not provided any information for tracing the characteristic and it is not possible to initialize the circuit without visiting the related leaf of the tree. In fact, the parallel adapter "preserves" the voltages; therefore $V_c(0)=V_1=V_o=V_{co}$ (the same information that had been provided is returned) and it is not possible to obtain $I_1$ as a function of $V_1$, because $V_1=V_{co}$ is satisfied by any value of $I_1$.

Visiting first of all the leaf of the resistance, the following is obtained:

$V_2=V_o=V_{co}, I_2=-V_2/R, I_1=I_o-I_2=0-(-V_2/R)=V_{co}/R.$

The present method of the binary tree is much more efficient compared with matrix-based methods as regards memory occupation but, in particular, as far as the calculation power required is concerned. The price to be paid is a greater complexity of the data structure that can be easily represented graphically (all that is necessary is to re-arrange the elements of the network so that they assume the classical form of the tree-like structure) but is much less simple to treat analytically.

Apart from a complexity that increases only linearly with the number of bipoles, other advantages include the intrinsic repetitive nature of the algorithms used to explore tree-like structures. This makes it possible to write a very compact code. Also, as it is explicit, this method permits relatively simple management of time-variant topologies.

As has already been noted, one of the advantages of physical model synthesis is modularity: starting from the model of the main components representing a musical instrument and knowing the method in which these interact in order to generate the sound, the model of the entire instrument is obtained. These "elementary blocks" can be re-used, possibly changing various parameters (physical dimensions, materials used, etc.) in order to construct other instruments. A first level of breakdown is represented by identification of two distinct functional blocks: the driver and the resonator.

The first is the part of the instrument in which vibration begins as it causes and possibly sustains vibration in the resonator, inserting energy in the system. This determines the properties of pitch of the sound, fundamental in identifying tone. The cords of the guitar, of the violin or of the piano and the acoustic tube of a flute or clarinet are examples of resonant blocks. The plectrum of the guitar, the bow of the violin, the hammers of the piano or the reed of a clarinet are, on the other hand, drivers. The interaction may be simply feed forward if the driver does not receive any return information from the resonator, as happens for example with the plectrum, or feedback is the two blocks exchange information in both directions, as happens in all persistently energized instruments said as wind and string instruments.

At this point, implementation of physical model synthesis in a virtual environment is considered in which, for example, an actor with a baton must be able to hit several membranes positioned at different points in space. Each membrane could be modeled with its baton in a single system but the most flexible solution (and that borders most closely on reality) consists in considering the two objects as distinct, envisaging a single baton and all the membranes necessary. In this way, it is not necessary to decide on the type of exciter beforehand in order to construct the membrane-baton models; the actor could collect on the scene any object that has this characteristic and use it to hit the membranes without having to replace the related models in real time. Also, each hit membrane must continue to oscillate following its natural decay even when the baton is definitively removed from it. This means that it must be possible to initialize the various blocks (usually driver and resonator) separately and this is difficult to achieve if these have been included in a single structure.

All these considerations highlight the advantages of the object-based approach in which the various parts are modeled separately and "molded together", making them interact only when necessary through a temporary connection that permits exchange of energy: the connection would be created when the two objects are sufficiently close, monitoring a suitable condition of proximity and then eliminated when they are moved away from each other. To render this possible, an explicit resolutive method is required, i.e. a method that makes it possible to obtain the reflected (outgoing) waves from the macro-adapter according to the incident waves.

Here, time-variance means the possibility of modifying the numeric value of one or more linear bipoles or the characteristics of the non-linear bipole. The change in topology or nature of one or more linear bipoles is obtained as a particular case of interaction between objects. Considering how it has been designed, the tree-like structure represents the linear part of the circuit, while the non-linear part can be considered as not belonging to this, as will be explained subsequently. According to what has been outlined above, it is easy to understand how functioning of these two blocks differs considerably and must therefore be dealt with separately.

As regards the linear part, it is not possible simply to change the value of a bipole as, doing this, it will no longer be in adaptation conditions. Therefore, it is necessary to also modify the resistance of the port to which it is connected and consequently all the ports of the adapters downstream of this, updating similarly all the reflection coefficients until non-linearity is reached.

The tree-like structure makes it possible to solve this problem in a very simple manner; in fact, the elements downstream of the bipole to be modified are all and only those belonging to the path that joins the bipole with the root of the tree. Once the leaf corresponding to the bipole to be modified has been identified, update of the structure consists in tracing the tree starting from this leaf and getting to the root, modifying suitable port resistances and re-calculating the reflection coefficient of each adapter visited. The operation is completed passing to non-linearity the new value of the port resistance of the root adapter, necessary to carry out transformation from the Kirchhoff domain to the wave domain. There are, however, parameters of certain bipoles, as the voltage of generators or the initial conditions of the reactive elements, that do not influence port resistance. These can be modified simply by identifying the bipole concerned inside the tree, updating the value required and leaving the rest of the structure unchanged.

A fairly general method for modifying the non-linearity characteristic consists in inserting a block that performs linear transformations on this, said as rigid translations, rotations and scalings. In this way, it is possible to obtain time-variance regardless of the way in which the non-linear bipole is implemented (analytically, via table, etc.).

Consider a set of independent physical systems, each of which forms an independent circuit or a tree connected to a non-linearity. It is necessary to understand how they must be connected and how their topology must be modified during the interaction. Assuming, for the sake of simplicity, that the two circuits are connected only via two wires, it is possible to consider inclusion in each of these of a "dummy" bipole which performs the function of interconnection port but which behaves in a completely transparent manner when the object is isolated, i.e. has nil resistance if connected in series to a branch of the circuit and infinite resistance if connected in parallel. However, it is not necessary to specify the type of port in the wave domain as this will be determined by the adapter to which it is connected.

Figure 10:
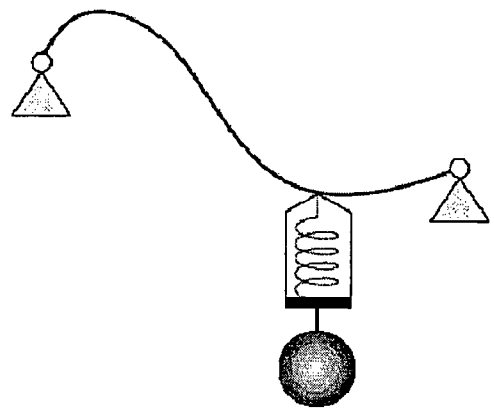
FIG. 10 shows an example of a physical model.

Consider, for example, a cord-hammer system, as shown in FIG. 10, in which the cord is assumed to be ideal while the hammer consists of a weight and of a felt with non-linear and non-dissipative compression. Although they can be modeled using a single circuit, the two objects are kept separate here, introducing the interconnection ports. During interaction, the following instants can be identified.

Figure 11:
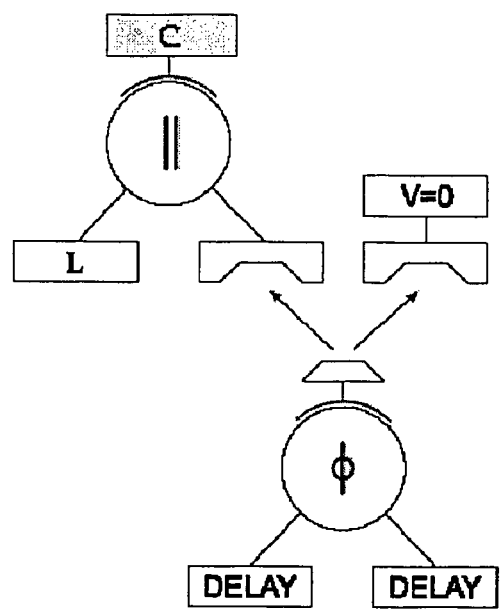
FIG. 11 shows a tree-like structure for the circuit of FIG. 10.

Initially the two objects are at a distance and the two ports are disconnected, as shown in FIG. 11. These are transparent to the respective circuits, i.e. the port of the cord object, as it is of the serial type, is a short-circuit, while the port of the hammer object, of a parallel type, behaves as an open circuit.

When the cord and hammer are close enough, the connection is created and the tree of the cord is "grafted" to the tree of the hammer to form a single structure. From a circuital point of view, nothing has yet changed as the serial adapter of the cord is still short-circuited, this time by the non-linear bipole, which is working in the −1 slope section of its characteristic.

The situation changes when the hammer touches the cord and the non-linearity passes into the right-hand half-plane of the characteristic where the slope is different from −1. From this instant, exchange of energy between the hammer and cord begins and will continue until the hammer, rebounding on the cord, moves away from this.

When the hammer moves to a sufficient distance, the connection is removed and the two circuits are once again isolated. The non-linearity "plug" of the cord (in this case a simple short-circuit) allows it to continue to evolve once disconnected from the hammer system.

It is possible to note, in this example, how the interconnection port system and the particular trend of the non-linearity (multiplied by a step function) partly perform the same task of modeling the contact conditions and there is therefore a certain level of redundancy. Generally speaking, the non-linearity characteristic could be defined only in the right-hand half plane establishing that the distance between the cord and hammer at which the connection is made between the ports is nil (proximity condition coinciding with the contact condition) or, vice versa, not use the interconnection ports and define the characteristic up to the maximum distance established between the two objects. In this latter case, the model is simpler as it is not necessary to manage interaction between several objects whereas, in the first case, it would be possible to obtain a smaller-size table, at the cost of a need for higher calculation power in order to make the connections, which should be updated between one sample and the next, in order to avoid discontinuity in the wave form generated. In the case considered, the best solution to guarantee flexible, simple management is to define the characteristic in the left-hand half plane up to the maximum distance at which rebounds occur and to use this distance for the connection condition. In this way, update of the connections will be less rigid as carried out at due distance from the effective point of contact.

From the above description it is clearly described a method for simulation of a physical model including the steps of conversion of the aforesaid physical model into an equivalent electrical circuit and application of the steps of the method in accordance with the method for simulation of an electrical circuit, as described above.

It is also clearly described a method for simulation of a musical instrument including the steps of representing said musical instrument with a physical model and application of the steps of the method in accordance with the method for simulation of a physical model described above, to the purpose of obtaining the generation of sounds produced by said simulation of a musical instrument.

It is also clearly described a method for obtaining an electric circuit obtained by applying the method for simulation of a musical instrument described above.

From the description of the method it is also clearly possible to embody an electric circuit obtained by applying the method for simulation of an electric circuit described above.

More particularly but not in a limiting sense, it is also evident how it is possible to realize a device simulating a musical instrument able to generate sounds obtained by applying the method for simulation of an electric circuit described above.

An embodiment example of such a device simulating a musical instrument comprises an equipment provided with a graphical interface of a known type, and of means for the implementation of the method according to the invention. With this equipment the user is able to build up a model of a simulator of any musical instrument, and then to use said model for generating sounds simulating the emission of the musical instrument.

The present invention can be advantageously implemented through a program for computer comprising program coding means for the implementation of one or more steps of the method, when this program is running on a computer. Therefore, it is understood that the scope of protection is extended to such a program for computer and in addition to a computer readable means having a recorded message therein, said computer readable means comprising program coding means for the implementation of one or more steps of the method, when this program is run on a computer, in particular for controlling the execution of all the steps according to the method for simulating an electric circuit described above.

From the above description the man skilled in the art is able to carry out the invention without introducing any further details, in particular relating to the embodiment of an electric circuit or of a device simulating a musical instrument able to generate sounds in accordance with the method for simulating an electric circuit described above.

The invention claimed is:

1. A method performed by a computer for simulating an electrical circuit, using digital wave structures, the method comprising:
   representing the electrical circuit by using a binary tree with a non-linear element and linear elements connected to a plurality of adapter blocks, wherein:
      an adapter block of the plurality of adapter blocks includes an adapted port to which another adapter block is connected;
      the plurality of adapter blocks are designated as nodes and the linear elements are designated as leaves;
      the nodes include a root node which represents a root adapter block of the plurality of adapter blocks, and wherein the root node is connected to the non-linear element;
   analyzing the binary tree by performing a process which includes using known incident wave values associated with the leaves connected to a first node to determine a reflected wave value of an adapted port of the first node;
   repeating the process for additional nodes, if present, that are connected between the root node and the first node, wherein the process is repeated by using the reflected wave value of the adapted port of the first node and additional known incident wave values associated with any additional leaves connected to the additional nodes to determine reflected wave values of adapted ports of the additional nodes;
   repeating the process for the root node to determine a reflected wave value of an adapted port of the root node; and
   determining an incident wave value of the adapted port of the root node.

2. The method of claim 1, further comprising:
   performing a return process starting from the root node toward the first node, wherein the return process includes using the incident wave value of the adapted port of the root node to determine any additional unknown incident or reflected wave values at ports of the first node and any of the additional nodes between the first node and the root node, if present.

3. The method of claim 1, wherein:
   the binary tree further comprises dynamic elements also represented by leaves; and
   the method further comprises updating a status of the dynamic elements using the reflected and incident wave values.

4. The method of claim 1, wherein the plurality of adapter blocks further comprises non-dynamic adapter blocks and dynamic adapter blocks.

5. The method of claim 1, wherein the incident wave value of the adapted port of the root node is computed using a characteristic equation of the non-linear element connected to the root node.

6. The method of claim 1, wherein, the plurality of adapter blocks further comprises an adapter block with three ports.

7. The method of claim 6, further comprising:
   assigning an initial state to the dynamic elements, wherein, in assigning the initial state, a capacitor is replaced by a voltage generator and an inductor is replaced by a current generator.

8. The method of claim 2, further comprising:
obtaining the voltage-current characteristic of each node in the binary tree;
working from the leaves of the first node towards the root node and determining an initial current or voltage value at each of the nodes;
starting from the root node and proceeding towards the leaves of the first node, using the initial current or voltage value at each of the nodes and the voltage-current characteristic to compute an unknown current or voltage value at each of the nodes.

9. The method of claim 1, wherein the electrical circuit is converted from a physical model.

10. The method of claim 9, wherein the physical model represents a musical instrument.

11. The method of claim 1, wherein the linear elements comprise an adapted resistor.

12. The method of claim 1, wherein the linear elements comprise an adapted real generator.

13. The method of claim 1, wherein the linear elements comprise a reactive element.

14. A tangible computer-readable medium having stored thereon computer-executable instructions that, in response to execution by a computing device, cause the computing device to perform operations, the operations comprising:
converting the physical model into an electrical circuit representation, wherein the electrical circuit representation is represented by a binary tree, and wherein the binary tree includes a non-linear element and linear elements connected to a plurality of adapter blocks, wherein:
an adapter block of the plurality of adapter blocks includes an adapted port to which another adapter block is connected;
the plurality of adapter blocks are designated as nodes and the linear elements are designated as leaves;
the nodes include a root node which represents a root adapter block of the plurality of adapter blocks, and wherein the root node is connected to the non-linear element;
analyzing the binary tree by performing a process which includes using known incident wave values associated with the leaves connected to a first node to determine a reflected wave value of an adapted port of the first node;
repeating the process for additional nodes, if present, that are connected between the root node and the first node, wherein the process is repeated by using the reflected wave value of the adapted port of the first node and additional known incident wave values associated with any additional leaves connected to the additional nodes to determine reflected wave values of adapted ports of the additional nodes.
repeating the process for the root node to determine a reflected wave value of an adapted port of the root node;
using a characteristic equation of the non-linear element connected to the root node, determining an incident wave value of the adapted port of the root node.

15. The tangible computer-readable medium of claim 14, wherein the plurality of adapter blocks comprise serial and parallel adapter blocks.

16. The tangible computer-readable medium of claim 14, wherein the physical model represents a musical instrument, and wherein simulation of the physical model allows for simulating sound emission from the musical instrument.

17. A method performed by a computer for simulating sounds produced by a musical instrument by representing the musical instrument with a physical model, the method comprising:
converting the physical model into an electrical circuit which is represented by a binary tree, wherein the binary tree includes a non-linear element and linear elements connected to a plurality of adapter blocks, wherein:
an adapter block of the plurality of adapter blocks includes an adapted port to which another adapter block is connected;
the plurality of adapter blocks are designated as nodes and the linear elements are designated as leaves;
the nodes include a root node which represents a root adapter block of the plurality of adapter blocks that is connected to the non-linear element;
analyzing the binary tree by performing a process which includes using known incident wave values associated with the leaves connected to a first node to determine a reflected wave value of an adapted port of the first node;
repeating the process for additional nodes, if present, that are connected between the root node and the first node, wherein the process is repeated by using the reflected wave value of the adapted port of the first node and additional known incident wave values associated with any additional leaves connected to the additional nodes to determine reflected wave values of adapted ports of the additional nodes;
repeating the process for the root node to determine a reflected wave value of an adapted port of the root node;
using a characteristic equation of the non-linear element connected to the root node, determining an incident wave value of the adapted port of the root node; and
performing a return process starting from the root node toward the first node, wherein the return process includes using the incident wave value of the adapted port of the root node to determine any additional unknown incident or reflected wave values at ports of the first node and any of the additional nodes between the first and root node, if present.

18. The method of claim 17, wherein:
the binary tree further comprises dynamic elements also represented by leaves; and
the method further comprises updating a status of the dynamic elements using the reflected and incident wave values.

* * * * *